(12) United States Patent
Yang et al.

(10) Patent No.: US 11,747,390 B2
(45) Date of Patent: Sep. 5, 2023

(54) APPARATUS AND METHOD FOR MEASURING DYNAMIC ON-RESISTANCE OF GAN-BASED DEVICE

(71) Applicant: Innoscience (Suzhou) Technology Co., Ltd., Suzhou (CN)

(72) Inventors: Rong Yang, Suzhou (CN); Sichao Li, Suzhou (CN); Chunhua Zhou, Suzhou (CN); Donghua Bai, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 303 days.

(21) Appl. No.: 17/267,505

(22) PCT Filed: Jan. 15, 2021

(86) PCT No.: PCT/CN2021/072012
§ 371 (c)(1),
(2) Date: Feb. 10, 2021

(87) PCT Pub. No.: WO2022/151308
PCT Pub. Date: Jul. 21, 2022

(65) Prior Publication Data
US 2022/0373590 A1    Nov. 24, 2022

(51) Int. Cl.
*G01R 31/26*    (2020.01)
(52) U.S. Cl.
CPC .................... *G01R 31/2621* (2013.01)

(58) Field of Classification Search
CPC  G01R 31/26; G01R 31/2621; G01R 31/2608; G01R 31/2642; G01R 27/02; G01R 31/2637
See application file for complete search history.

(56) References Cited

U.S. PATENT DOCUMENTS 9,954,522 B2    4/2018  Lu et al.
2014/0139206 A1*  5/2014  Hirose ............... G01R 1/06766
                                              324/132
(Continued)

FOREIGN PATENT DOCUMENTS

CN        207516495 U      6/2018
CN        108718150 A      10/2018
(Continued)

OTHER PUBLICATIONS

International Search Report and Written Opinion of the corresponding PCT application No. PCT/CN2021/072012 dated Oct. 12, 2021.

*Primary Examiner* — Son T Le
(74) *Attorney, Agent, or Firm* — McCoy Russell LLP

(57) ABSTRACT

The subject application provides an apparatus and method for measuring dynamic on-resistance of a device under test (DUT) comprising a control terminal electrically connected to an output of a first controlling module being configured to generate a first control signal to switch on and off the DUT. The apparatus comprises a switching device and a second controlling module configured to: receive the first control signal from the first controlling module and generate a second control signal to switch on and off the switching device such that the switching device is turned on later than the DUT for a first time interval and turned off earlier than the DUT for a second time interval.

18 Claims, 8 Drawing Sheets

(56) References Cited

U.S. PATENT DOCUMENTS

2014/0203821 A1* 7/2014 Yamamoto .............. H01L 22/14
324/654
2017/0254842 A1* 9/2017 Bahl ...................... G01R 27/02

FOREIGN PATENT DOCUMENTS

| CN | 110286320 A | 9/2019 |
| CN | 110824322 A | 2/2020 |
| CN | 111289799 A | 6/2020 |
| CN | 111337807 A | 6/2020 |
| CN | 112154337 A | 12/2020 |
| JP | 5267053 B2 | 8/2013 |

* cited by examiner

APPARATUS AND METHOD FOR MEASURING DYNAMIC ON-RESISTANCE OF GAN-BASED DEVICE

TECHNICAL FIELD

The subject application generally relates to an apparatus and method for measuring dynamic on-resistance of a semiconductor device, and more particularly relates to an apparatus and method for measuring dynamic on-resistance of a gallium nitride (GaN) power device.

BACKGROUND

GaN power devices have been widely used for high frequency electrical energy conversion systems because of low power losses and fast switching transition. In comparison with silicon Metal Oxide Semiconductor Field Effect Transistor (MOSFET), GaN High-Electron-Mobility Transistor (HEMT) has a much better figure of merit and more promising performance for high-power, high-frequency applications. However, GaN power device may have an unwanted current collapse phenomenon resulting in increase in dynamic on-resistance which can cause device degradation and failure. Therefore, dynamic on-resistance measurement is important for performance evaluation and circuit diagnosis of GaN power devices.

One challenge in measuring dynamic on-resistance of a GaN power device is that the GaN power device may have a drain-to-source voltage of a few hundred volts at OFF state and around 10 millivolts at ON state. Therefore, the full range drain-to-source voltage of the GaN power device is too large for a typical oscilloscope to obtain a desired measurement resolution and accuracy.

SUMMARY

An object of the subject application is to address aforesaid challenges and provide a dynamic on-resistance measuring apparatus and method which is low cost and convenient to use.

According to one aspect of the subject application, it is provided an apparatus for measuring dynamic on-resistance of a GaN-based device under test (DUT) comprising a control terminal electrically connected to an output of a first controlling module being configured to generate a first control signal to switch on and off the DUT. The apparatus comprises a switching device and a second controlling module configured to receive the first control signal from the first controlling module and generate a second control signal to switch on and off the switching device such that the switching device is turned on later than the DUT for a first time interval and turned off earlier than the DUT for a second time interval.

According to another aspect of the subject application, it is provided a method for measuring dynamic on-resistance of a GaN-based device under test (DUT) having a control terminal. The method comprises: connecting the control terminal of the DUT to an output of a first controlling module; connecting the output of the first controlling module to an input of a second controlling module; connecting a control terminal of a switching device to an output of the second controlling module; generating, by the first controlling module, a first control signal to switch on and off the DUT; receiving, by the second controlling module, the first control signal from the first controlling module; and generating, by the second controlling module, a second control signal to switch on and off the switching device such that the switching device is turned on later than the DUT for a first time interval and turned off earlier than the DUT for a second time interval.

In comparison with conventional passive clamping approach, the provided measuring apparatus and method can achieve higher measurement accuracy because the measuring result is not dependent on a diode voltage. On the other hand, the provided measuring apparatus and method does not need a special microcontroller unit (MCU) configured for generating two synchronized control signals to control the DUT and the switching device respectively, therefore has lower costs than conventional active clamping approach.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

In the following description, embodiments of dynamic on-resistance measuring apparatus and method are set forth as preferred examples in accordance with the subject application. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Reference in this specification to "one embodiment" or "an embodiments" means that a particular feature, structure, or characteristic described in connection with the embodiment is included in at least one of the embodiments of the invention. The appearances of the phrase "in one embodiment" or "in some embodiments" in various places in the specifications are not necessarily all referring to the same embodiments, nor are separate or alternative embodiments mutually exclusive of other embodiments. Moreover, various features are described which may be exhibited by some embodiments and not by others.

Figure 1:
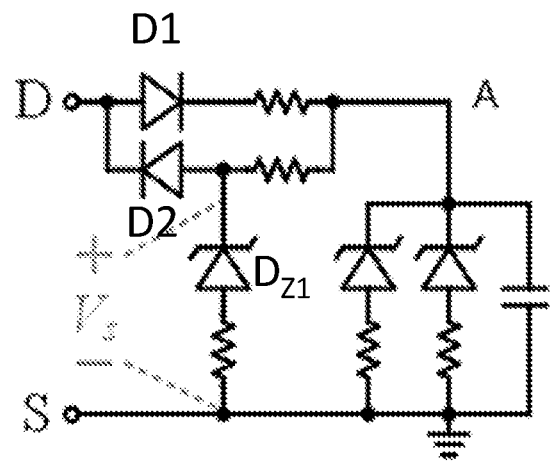
FIG. 1 depicts a dynamic on-resistance measuring circuit according to a comparative embodiment of the subject application.

FIG. 1 depicts a dynamic on-resistance measuring circuit according to a comparative embodiment of the subject application. In this comparative embodiment, a passive voltage clamping circuit is used to alter the drain-to-source voltage of GaN device to be measured. When the GaN device is switched off, its drain-to-source voltage $V_{DS}$ is higher than voltage at node A, diode D1 is forward-biased, diode D2 is reversed-biased, capacitor C1 is charged and the voltage $V_S$ which is to be measured by an oscilloscope is clamped to a low level by the Zener diode Dz1. When the GaN device is switched on, the voltage $V_{DS}$ is lower than the voltage at node A since capacitor C1 has been charged, diode D1 is reverse-biased and diode D2 is forward-biased. The drain-to-source voltage $V_{DS}$ can be obtained by measuring the voltage $V_S$ by the oscilloscope, as given by $V_{DS}=V_S-V_{D2}$, where $V_{D2}$ is the voltage across the diode D2. However, as the diode voltage $V_{D2}$ is dependent on the conduction current and operating temperature, the measurement accuracy may be affected, especially when the GaN device under test has a very small on-resistance (e.g. as low as ~10 mΩ).

Figure 2:
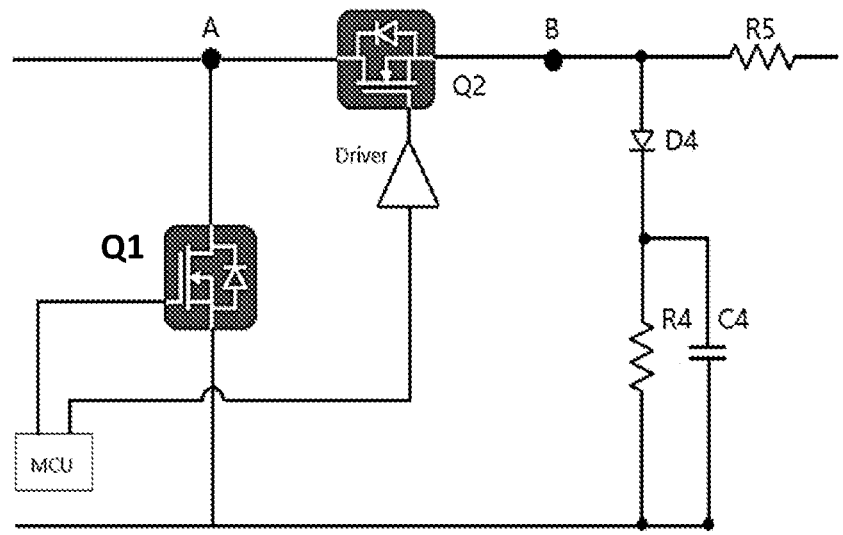
FIG. 2 depicts a dynamic on-resistance measuring circuit according to another comparative embodiment of the subject application.

FIG. 2 depicts a dynamic on-resistance measuring circuit according to another comparative embodiment of the subject application. In this comparative embodiment, a micro-controller unit (MCU) is used to drive a GaN power device under test Q1 as well as a switching device Q2 to actively clamp the drain-to-source voltage of the GaN power device Q1 to be measured by the oscilloscope. The active clamping circuit can provide higher measurement accuracy than the passive clamping circuit as the measured voltage is independent of diode temperature but its cost is relatively high as a special MCU with synchronization function for synchronizing Q2 with Q1 is required.

Figure 3:
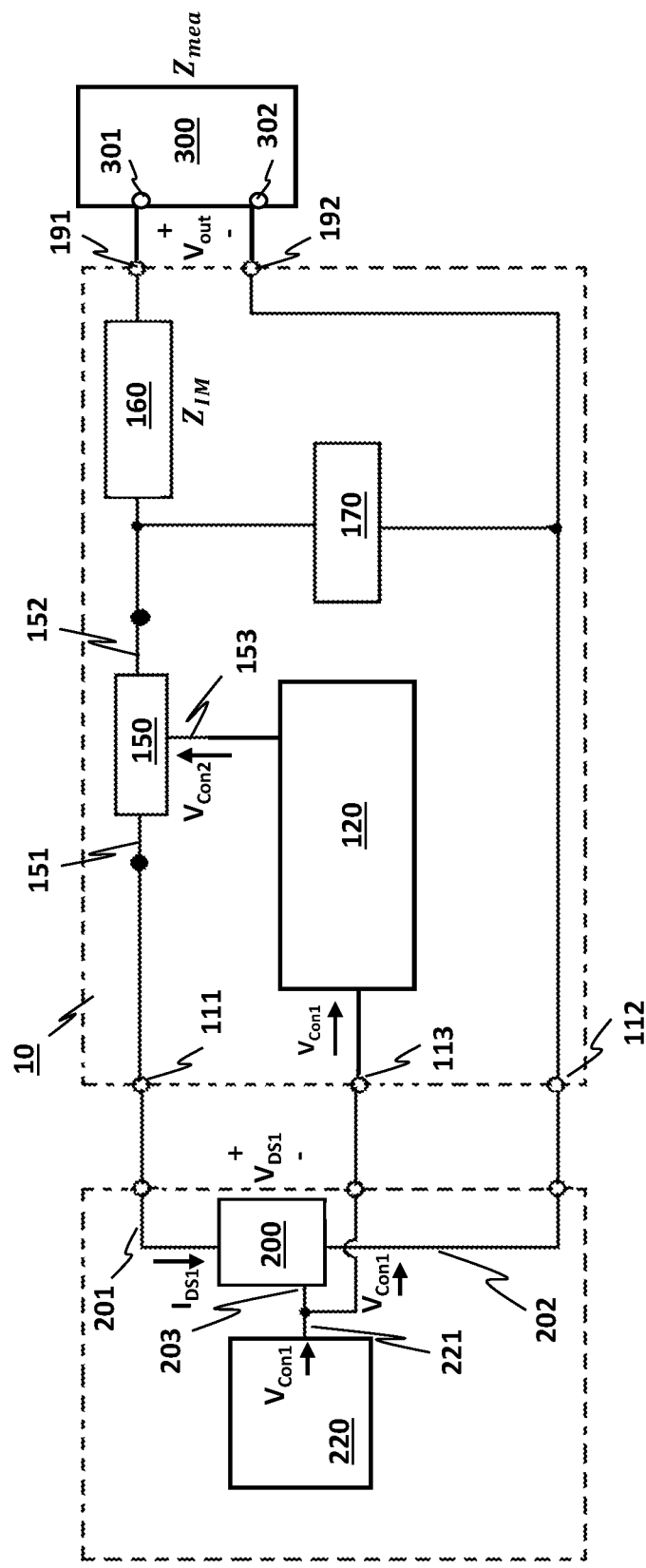
FIG. 3 depicts a block diagram of a dynamic on-resistance measuring apparatus and how it is implemented to measure on-resistance of a GaN-based device under test (DUT) according to an embodiment of the subject application.

FIG. 3 depicts a block diagram of a dynamic on-resistance measuring apparatus 10 and how it is implemented to measure on-resistance of a GaN-based device under test (DUT) 200 according to an embodiment of the subject application.

The DUT 200 may have a first power terminal 201 electrically connected to a first output node of a power supply, a second power terminal 202 electrically connected to a second output node of the power supply, and a control terminal 203 electrically connected to an output terminal 221 of a controller module 220. The controller module 220 may be configured to generate a control signal Vcon1 to switch on and off the DUT 200. When the control signal Vcon1 is high, the DUT 200 is turned on. When the control signal Vcon1 is low, the DUT 200 is turned off.

The DUT 200 may be a GaN field effect transistor (FET) device having a drain terminal being the first power terminal 201, a source terminal being the second power terminal 202 and a gate terminal being the control terminal 203.

The measuring apparatus 10 may comprise an input interface comprising a first input node 111 configured for being electrically connected to the first power terminal 201 of the DUT 200, a second input node 112 configured for being electrically connected to the second power terminal 202 of DUT 200, and a control input node 113 configured for being electrically connected to the output terminal 221 of the controlling module 220.

In some embodiments, the input interface of the measuring apparatus 10 may be an electrical connector comprising a first pin or position being the first input node 111, a second pin or position being the second input node 112 and a third pin or position being the control input node 113.

In some embodiments, the measuring apparatus 10 may be connected to the DUT 200 by soldering the first input node to a solder pad connected to the first power terminal 201 of the DUT 200, the second input node 112 to a solder pad connected to the second power terminal 202 of DUT 200, and the control input node to a solder pad connected to the output terminal 221 of the controlling module 220.

The measuring apparatus 10 may further comprise an output interface comprising a first output node 191 configured for being electrically connected to a first signal input node 301 of an electrical signal monitoring equipment 300 and a second output node 192 electrically connected to the second input node 112 and configured for being electrically connected to a second signal input node 302 of the electrical signal monitoring equipment 300. The electrical signal monitoring equipment 300 may be an oscilloscope or any signal analyzer for monitoring electrical signal waveforms from the measuring apparatus 10.

In some embodiments, the output interface of the measuring apparatus 10 may be a coaxial RF connector, such as, but not limited to, a BNC (Bayonet Neill-Concelman) connector and a SMA (SubMiniature version A) connector.

The measuring apparatus 10 may further comprise a switching device 150 comprising a control terminal 153, a first power terminal 151 electrically connected to the first input node 111, and a second power terminal 152 electrically coupled to the first output node 191 through an impedance matching module 160 and to the second output node 192 through a noise absorption circuit module 170.

The measuring apparatus 10 may further comprise a controlling module 120 comprising an input electrically connected to the control input node 113 and an output electrically connected to the control terminal 153 of the switching device 150. The controlling module 120 is configured to receive the control signal Vcon1 from the controlling module 220 and generate a control signal Vcon2 to switch on and off the switching device 150. When the control signal Vcon2 is high, the switching device 150 is turned on. When the control signal Vcon2 is low, the switching device 150 is turned off.

Figure 4:
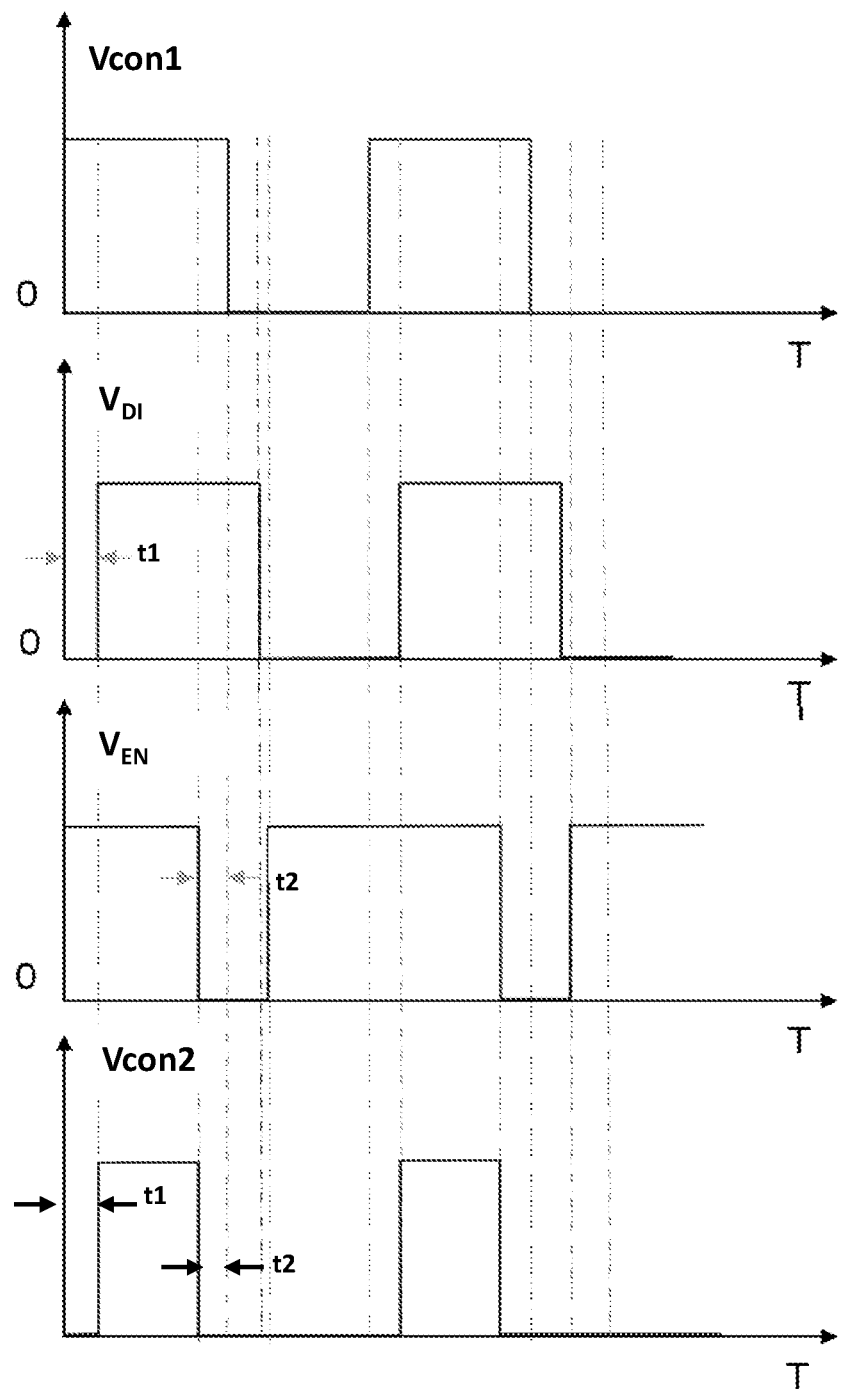
FIG. 4 depicts waveforms of electrical signals in measuring dynamic on-resistance of a GaN-based device under test (DUT) according to an embodiment of the subject application.

FIG. 4 depicts waveforms of electrical signals in measuring dynamic on-resistance of a GaN-based device under test (DUT) with the measuring apparatus 10. Referring to FIG. 4. The second control signal Vcon2 rises from a low level to a high level later than the first control signal Vcon1 rising from a low level to a high level for a time interval t1, and falls from the high level to the low level earlier than the first control signal Vcon1 falling from the high level to the low level for a second time interval t2. As such, the switching device 150 is turned on later than the DUT 200 for time interval t1 and the switching device 150 is turned off earlier than the DUT 200 for time interval t2.

Figure 5:
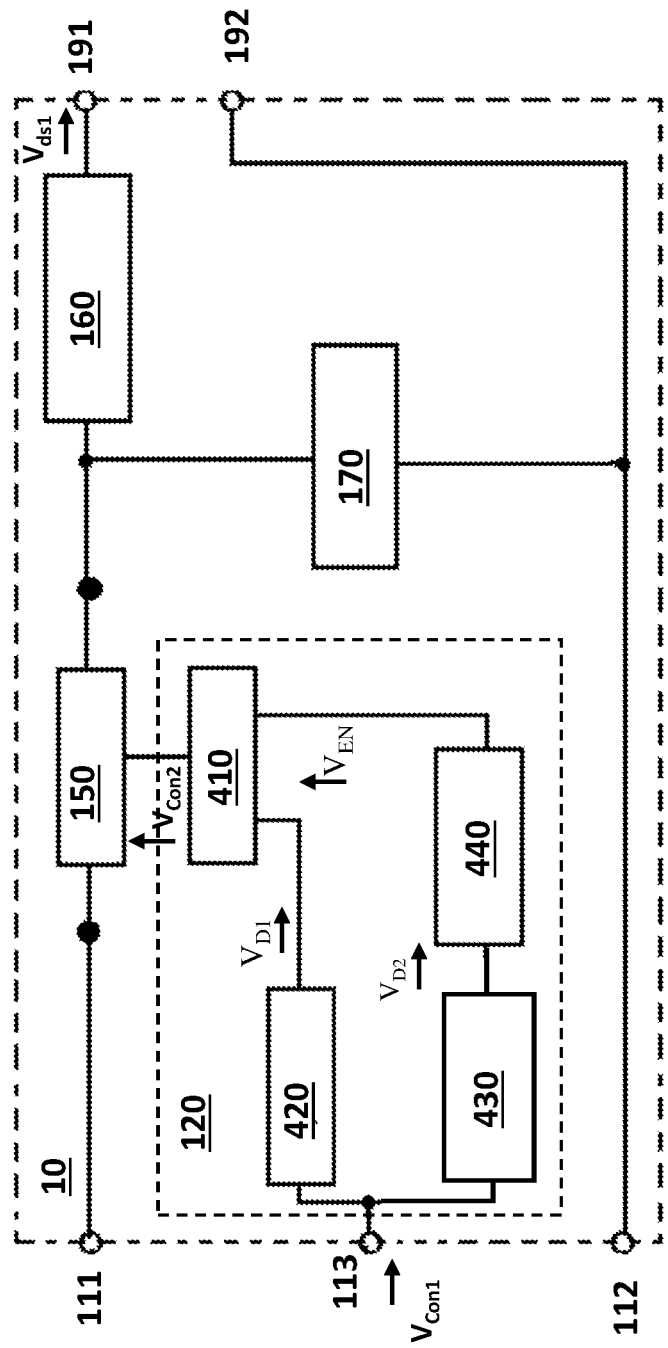
FIG. 5 depicts a more detailed block diagram of the dynamic on-resistance measuring apparatus according to an embodiment of the subject application.

FIG. 5 depicts a more detailed block diagram of the dynamic on-resistance measuring apparatus 10. Referring to FIG. 5. The controlling module 120 may comprise a driving module 410 configured to receive a driver input signal $V_{DI}$ and an enabling signal $V_{EN}$, and generate the second control signal Vcon2 to switch on and off the switching element.

The controlling module 120 may further comprise a first delay module 420 configured to receive the first control signal Vcon1 and generate a driver input signal $V_{DI}$ to the driving module 410.

The controlling module 120 may further comprise a second delay module 430 configured to receive the first control signal Vcon1 and a level reversal module electrically connected to the second delay module 430 and configured to generate the enabling signal $V_{EN}$.

Referring back to FIG. 4. A rising edge of the driver input signal $V_{DI}$ is delayed from a rising edge of the first control signal Vcon1 for the time interval t1. A falling edge of the enabling signal $V_{EN}$ is ahead of a falling edge of the first control signal Vcon1 for the time interval t2. Consequently, the second control signal Vcon2 has a rising edge being delayed from the rising edge of the first control signal Vcon1 for the time interval t1, and a falling edge being ahead of the falling edge of the first control signal Vcon1 for the second time interval t2.

Figure 6:
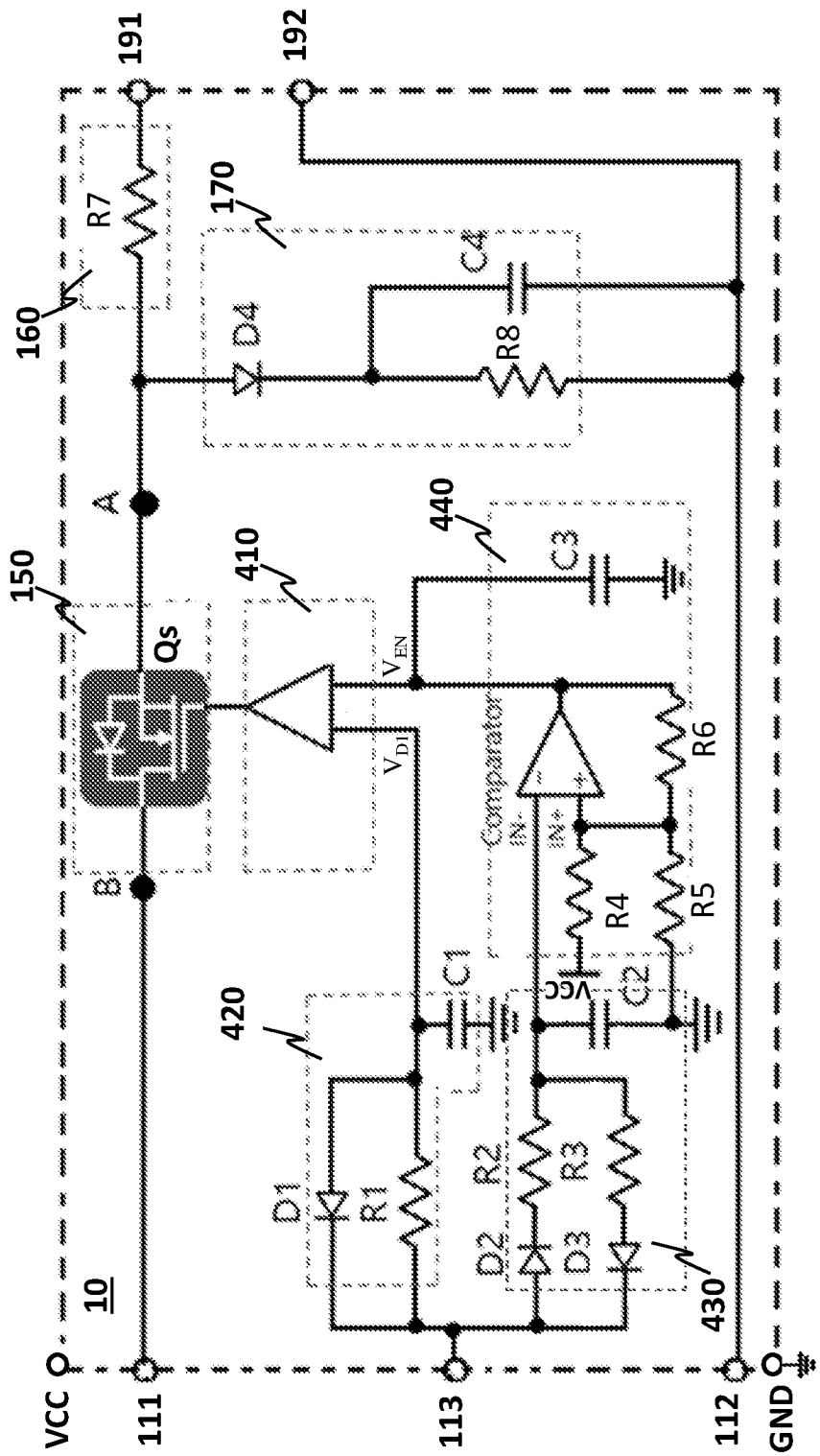
FIG. 6 depicts a circuit diagram of the dynamic on-resistance measuring apparatus according to an embodiment of the subject application.

FIG. 6 depicts a circuit diagram of the dynamic on-resistance measuring apparatus 10 according to an embodiment of the subject application.

The switching device 150 may be constructed with, for example but not limited to, a high electron mobility transistor (HEMT) or a metal oxide semiconductor field effect transistor (MOSFET). The structure of the transistor may be selected from N-channel enhancement type, N-channel depletion type, P-channel enhancement type, or P-channel depletion type. The transistor may be formed of or include a direct bandgap material, such as an III-V compound, which includes, but not limited to, for example, GaAs, InP, GaN, InGaAs and AlGaAs.

In the example of FIG. 6, the switching device 150 is constructed with a N-channel MOSFET Qs having a drain terminal electrically connected to the first input node 111, and a source terminal electrically coupled to the first output node 191 through an impedance matching module 160 and to the second output node 192 through a noise absorption circuit module 170.

The first delay module 420 may comprise a first capacitor C1 having a first terminal electrically connected to a first input of the driving module 410 and a second terminal electrically connected to a GND node for coupling to a ground potential; a first diode D1 having a cathode electrically connected to the control input node 113 and an anode electrically connected to the first terminal of the first capacitor C1; and a first resistor R1 is electrically connected in parallel with the first diode D1.

The capacitance of capacitor C1 may range approximately from 330 nF to 1 nF. The resistance of resistor R1 may range approximately from 220Ω to 5 KΩ. The diode D1 may be a PN junction rectifier diode.

The second delay module 430 may comprise a second capacitor C2 having a first terminal electrically connected to an input of the level reversal module and a second terminal electrically connected to the GND node; a second diode D2 having an anode electrically connected to the control input node 113; a second resistor R2 having a first terminal electrically connected to a cathode of the second diode D2 and a second terminal electrically connected to the first terminal of the second capacitor C2; a third diode D3 having a cathode electrically connected to the control input node 113; and a third resistor R3 having a first terminal electrically connected to an anode of the third diode D3 and a second terminal electrically connected to the first terminal of the second capacitor C2.

The capacitance of capacitor C2 may range approximately from 330 pF to 1 nF. The resistance of resistor R2 may range approximately from 220Ω to 5 KΩ. The resistance of resistor R3 may range approximately from 220Ω to 5 KΩ. The diodes D2 and D3 may be a PN junction rectifier diode.

Preferably, the resistor R1, the resistor R2 and the resistor R3 are adjustable resistors, such as rheostats.

The level reversal module 440 may comprise a third capacitor C3 having a first terminal electrically connected to a second input of the driving module 410 and a second terminal electrically connected to the GND node; a fourth resistor R4 having a first terminal electrically connected to a VCC node for coupling to a DC power supply; a fifth resistor R5 having a first terminal electrically connected to a second terminal of the fourth resistor R4 and a second terminal electrically connected to the GND node; a sixth resistor R6 having a first terminal electrically connected to the first terminal of the fifth resistor R5 and a second terminal electrically connected to the second input of the driving module 410; and a comparator having a negative input electrically connected to the first terminal of the second capacitor C2, a positive input electrically connected to the second terminal of the fourth resistor R4, and an output electrically connected to the second input of the driving module 410.

The DC power supply may have a typical supply voltage equal to any one of 1.2 V, 1.8 V, 2.4 V, 3.3 V, 5 V and 12 V. Preferably, the DC power supply may have a typical supply voltage equal to 5 V.

The capacitance of capacitor C3 may range approximately from 330 pF to 1 nF. The resistance of resistor R4 may range approximately from 220Ω to 5 KΩ. The resistance of resistor R5 may range approximately from 220Ω to 5 KΩ. The resistance of resistor R6 may range approximately from 220Ω to 5 KΩ.

The impedance matching module 160 may comprise a seventh resistor R7 having a first terminal electrically connected to the second terminal of the switching element 150 and a second terminal electrically connected to the first output node 191. The resistance of resistor R7 may range approximately from 50Ω to 100Ω.

The absorption circuit module 170 may comprise a fourth diode D4 having a first terminal electrically connected to the second terminal of the switching element 150; an eighth resistor R8 having a first terminal electrically connected to a second terminal of the fourth diode D4 and a second terminal electrically connected to the second output node 192; and a fourth capacitor C4 electrically connected in parallel with the eighth resistor R8. The capacitance of capacitor C4 may range approximately from 220 pF to 2.2 nF. The resistance of resistor R8 may range approximately from 10Ω to 100Ω. The diode D4 may be a PN junction rectifier diode.

Referring back to FIG. 3. The drain-to-source voltage $V_{DS1}$ of the DUT 200 can be measured by the equipment 300, as given by $$V_{DS1} = V_{out} * \left(\frac{Z_{IM} + Z_{mea}}{Z_{mea}}\right),$$

where $V_{out}$ is the voltage across the first and second output nodes 191 and 192, $Z_{IM}$ is the impedance of the impedance matching module 160, which is equal to R7, and $Z_{mea}$ is the impedance of the equipment 300, which may be typically equal to 50Ω.

Then, the on-resistance $R_{DS\_ON}$ of the DUT 200 can be obtained from the measured drain-to-source voltage $V_{DS1}$ of the DUT 200, as given by $$R_{DS\_ON} = \frac{V_{DS1}}{I_{DS1}},$$

where $I_{DS1}$ is the current flowing through the DUT 200.

Figure 7:
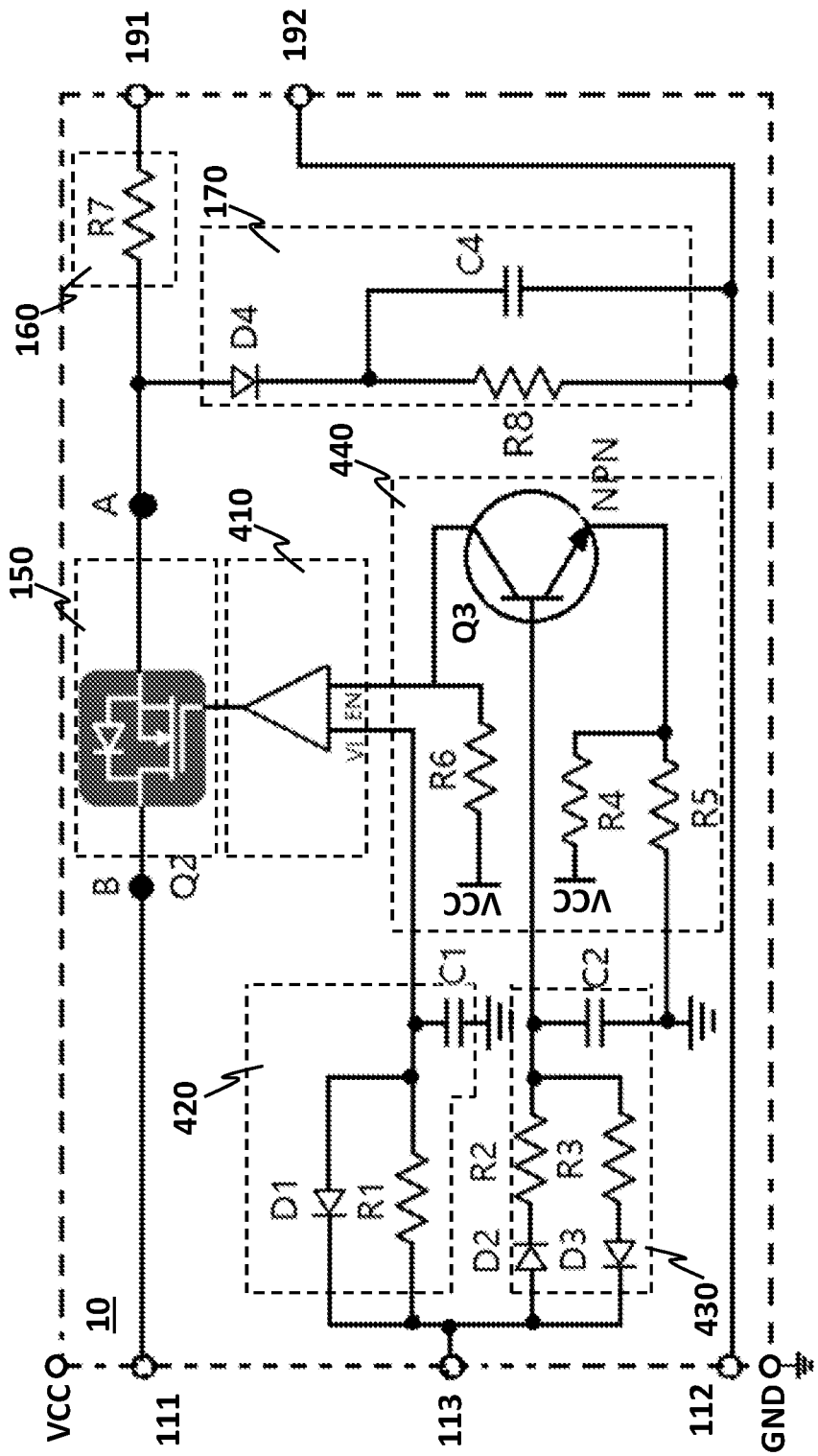
FIG. 7 depicts a circuit diagram of a dynamic on-resistance measuring apparatus according to another embodiment of the subject application.
Figure 8:
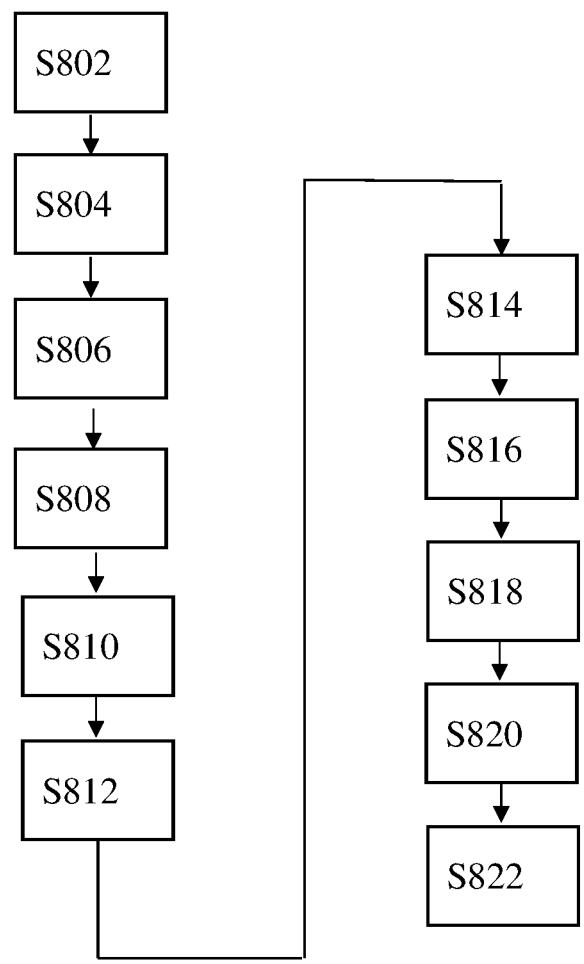
FIG. 8 depicts a flow chart of a method for measuring dynamic on-resistance of a GaN-based device under test (DUT) according to some embodiments of the subject application.

FIG. 7 depicts a circuit diagram of a dynamic on-resistance measuring apparatus according to another embodiment of the subject application. This embodiment is similar to the embodiment of FIG. 7 except for configuration of the level reversal module. Referring to FIG. 8, the level reversal module 440 may comprise a transistor Q3 having a collector terminal electrically connected to the second input of the driving module 410, a base terminal electrically connected to first terminal of the second capacitor C2; a fourth resistor R4 having a first terminal electrically connected to an emitter terminal of the transistor Q3 and a second terminal electrically connected to the VCC node; a fifth resistor R5 having a first terminal electrically connected to the emitter terminal of the transistor Q3 and a second terminal electrically connected to the GND node; and a sixth resistor R6 having a first terminal electrically connected to the second input of the driving module 410 and a second terminal electrically connected to the VCC node.

The transistor Q3 may be a NPN bipolar transistor. The resistance of resistor R4 may range approximately from 1 KΩ to 5 KΩ. The resistance of resistor R5 may range approximately from 1 KΩ to 5 KΩ. The resistance of resistor R6 may range approximately from 1 KΩ to 2 KΩ.

FIG. 8 depicts a flow chart of a method for measuring dynamic on-resistance of a GaN-based device under test according to some embodiments of the subject application. The device under test may have a first power terminal, a second power terminal and a control terminal. Referring to FIG. 8, the method may comprise the following steps:

S802: connecting the first power terminal of the DUT to a first output node of a power supply, the second power terminal of the DUT to a second output node of the power supply, and the control terminal of the DUT to an output of a first controlling module, respectively;

S804: connecting a first power terminal of a switching device to the first power terminal of the DUT;

S806: coupling a second power terminal of the switching device to a signal input node of an electrical signal monitoring equipment through an impedance matching module;

S808: coupling the second power terminal of the switching device to the second input node through a noise absorption circuit module;

S810: connecting the output of the first controlling module to an input of a second controlling module;

S812: connecting a control terminal of the switching device to an output of the second controlling module;

S814: generating, by the first controlling module, a first control signal to switch on and off the DUT;

S816: receiving, by the second controlling module, the first control signal from the first controlling module;

S818: generating, by the second controlling module, a second control signal to switch on and off the switching device such that the switching device is turned on later than the DUT for a first time interval and turned off earlier than the DUT for a second time interval;

S820: measuring, by the electrical signal monitoring equipment, a voltage $V_{out}$ across a first and second output nodes, and calculating a drain-to-source voltage $V_{DS1}$ of the DUT as given by $$V_{DS1} = V_{out} * \left(\frac{Z_{IM} + Z_{mea}}{Z_{mea}}\right),$$

where $V_{out}$ is the voltage across the first and second output nodes, $Z_{IM}$ is the impedance of the impedance matching module, and $Z_{mea}$ is the impedance of the electrical signal monitoring equipment, which may be typically equal to 50Ω; and S822: obtaining, an on-resistance $R_{DS\_ON}$ of the DUT from the measured drain-to-source voltage $V_{DS1}$ of the DUT, as given by $$R_{DS\_ON} = \frac{V_{DS1}}{I_{DS1}},$$

where $I_{DS1}$ is the current flowing through the DUT.

Figure 9:
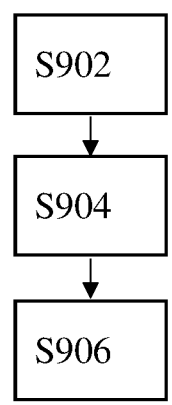
FIG. 9 depicts a flowchart of the step of generating the second control signal based on the first control signal according to some embodiments of the subject application.

FIG. 9 depicts a flowchart of the step of generating the second control signal based on the first control signal according to some embodiments of the subject application. Referring to FIG. 9, the generating of the second control signal comprises the following steps:

S902: generating, by a first delay module, a driver input signal based on the first control signal;

S904: generating, by a second delay module and a level reversal module, an enabling signal based on the first control signal;

S906: generating, by a driving module, the second control signal based on the driver input signal and the enabling signal.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. An apparatus for measuring dynamic on-resistance of a GaN-based device under test (DUT) comprising a first power terminal electrically connected to a first output node of a power supply, a second power terminal electrically connected to a second input node of the power supply, and a control terminal connected to an output of a first controlling module being configured to generate a first control signal to switch on and off the DUT, the apparatus comprising:

an input interface comprising a first input node configured for being electrically connected to the first power terminal of the DUT, a second input node configured for being electrically connected to the second power terminal of the DUT, and a control input node configured for being electrically connected to the output of the first controlling module;

an output interface comprising a first output node configured for being electrically connected to a first signal input node of an electrical signal monitoring equipment and a second output node connected to the second input node and configured for being electrically connected to a second signal input node of the electrical signal monitoring equipment;

a switching device comprising a control terminal, a first power terminal electrically connected to the first input node, and a second power terminal electrically coupled to the first output node through an impedance matching module and coupled to the second output node through a noise absorption circuit module;

a second controlling module comprising an input terminal electrically connected to the control input node and an output terminal electrically connected to the control terminal of the switching device; and being configured to:
receive the first control signal from the first controlling module; and generate a second control signal to switch on and off the switching device such that the switching device is turned on later than the DUT for a first time interval and turned off earlier than the DUT for a second time interval, wherein the second controlling module comprises:
a driving module configured to receive a driver input signal and an enabling signal, and generate the second control signal to switch on and off the switching element;
a first delay module configured to receive the first control signal and generate the driver input signal to the driving module;
a second delay module configured to receive the first control signal; and
a level reversal module connected to the second delay module and configured to generate the enabling signal to the driving module.

2. The apparatus according to claim 1, wherein the impedance matching module comprises a seventh resistor R7 having a first terminal connected to the second terminal of the switching element and a second terminal connected to the first output node.

3. The apparatus according to claim 1, wherein the absorption circuit module comprises:
a fourth diode D4 having a first terminal connected to the second terminal of the switching element;
an eighth resistor R8 having a first terminal connected to a second terminal of the fourth diode D4 and a second terminal connected to the second output node; and
a fourth capacitor C4 connected in parallel with the eighth resistor R8.

4. The apparatus according to claim 1, wherein the switching element is high electron mobility transistor (HEMT) device.

5. The apparatus according to claim 1, wherein the first delay module comprises:
a first capacitor C1 having a first terminal connected to a first input of the driving module and a second terminal connected to a GND node for coupling to a ground potential;

a first diode D1 having a cathode connected to the control input node and an anode connected to a first terminal of the first capacitor C1; and
a first resistor R1 is connected in parallel with the first diode D1.

6. The apparatus according to claim 5, wherein the first resistor R1 is an adjustable resistor.

7. The apparatus according to claim 1, wherein the second delay module comprises:
a second capacitor C2 having a first terminal connected to an input of the level reversal module and a second terminal connected to a GND node;
a second diode D2 having an anode connected to the control input node;
a second resistor R2 having a first terminal connected to a cathode of the second diode D2 and a second terminal connected to the first terminal of the second capacitor C2;
a third diode D3 having a cathode connected to the control input node; and
a third resistor R3 having a first terminal connected to an anode of the third diode D3 and a second terminal connected to the first terminal of the second capacitor C2.

8. The apparatus according to claim 7, wherein the second resistor R2 and the third resistor R3 are adjustable resistors.

9. The apparatus according to claim 1, wherein the level reversal module comprises:
a third capacitor C3 having a first terminal connected to a second input of the driving module and a second terminal connected to a GND node for coupling to a ground potential;
a fourth resistor R4 having a first terminal connected to a VCC node for coupling to a DC power supply;
a fifth resistor R5 having a first terminal connected to a second terminal of the fourth resistor R4 and a second terminal connected to the GND node;
a sixth resistor R6 having a first terminal connected to the first terminal of the fifth resistor R5 and a second terminal connected to the second input of the driving module; and
a comparator having a negative input connected to the first terminal of the second capacitor C2, a positive input connected to the second terminal of the fourth resistor R4, and an output connected to the second input of the driving module.

10. The apparatus according to claim 1, wherein the level reversal module comprises:
a transistor having a collector terminal connected to a second input of the driving module, a base terminal connected to the first terminal of the second capacitor C2;
a fourth resistor R4 having a first terminal connected to an emitter terminal of the transistor and a second terminal connected to a VCC node for coupling to a DC power supply;
a fifth resistor R5 having a first terminal connected to the emitter terminal of the transistor and a second terminal connected to a GND node for coupling to a ground potential; and
a sixth resistor R6 having a first terminal connected to the second input of the driving module and a second terminal connected to the VCC node.

11. A method for measuring dynamic on-resistance of a GaN-based device under test (DUT) having a first power terminal, a second power terminal and a control terminal, the method comprising:

connecting the first power terminal of the DUT to a first output node of a power supply, the second power terminal of the DUT to a second output node of the power supply, and the control terminal of the DUT to an output of a first controlling module, respectively;

connecting a first power terminal of a switching device to the first power terminal of the DUT;

coupling a second power terminal of the switching device to a first signal input node of an electrical signal monitoring equipment through an impedance matching module;

coupling the second power terminal of the switching device to the second input node through a noise absorption circuit module;

connecting the output of the first controlling module to an input of a second controlling module;

connecting a control terminal of the switching device to an output of the second controlling module;

generating, by the first controlling module, a first control signal to switch on and off the DUT;

receiving, by the second controlling module, the first control signal from the first controlling module; and generating, by the second controlling module, a second control signal to switch on and off the switching device such that the switching device is turned on later than the DUT for a first time interval and the switching device is turned off earlier than the DUT for a second time interval, wherein the generation of the second control signal comprising:
- generating, by a first delay module, a driver input signal based on the first control signal;
- generating, by a second delay module and a level reversal module, an enabling signal based on the first control signal;
- generating, by a driving module, the second control signal based on the driver input signal and the enabling signal.

12. The method according to claim 11, wherein the impedance matching module comprises a seventh resistor R7 having a first terminal connected to the second terminal of the switching element and a second terminal connected to the first output node.

13. The method according to claim 11, wherein the absorption circuit module comprises:
- a fourth diode D4 having a first terminal connected to the second terminal of the switching element;
- an eighth resistor R8 having a first terminal connected to a second terminal of the fourth diode D4 and a second terminal connected to the second output node; and
- a fourth capacitor C4 connected in parallel with the eighth resistor R8.

14. The method according to claim 11, wherein the switching element is high electron mobility transistor (HEMT) device.

15. The method according to claim 11, wherein the first delay module comprises:
- a first capacitor C1 having a first terminal connected to the first input of the driving module and a second terminal connected to a GND node for coupling to a ground potential;
- a first diode D1 having a cathode connected to the control input node and an anode connected to a first terminal of the first capacitor C1; and
- a first resistor R1 is connected in parallel with the first diode D1.

16. The method according to claim 11, wherein the second delay module comprises:
- a second capacitor C2 having a first terminal connected to an input of the level reversal module and a second terminal connected to a GND node for coupling to a ground potential;
- a second diode D2 having an anode connected to the control input node;
- a second resistor R2 having a first terminal connected to a cathode of the second diode D2 and a second terminal connected to the first terminal of the second capacitor C2;
- a third diode D3 having a cathode connected to the control input node; and
- a third resistor R3 having a first terminal connected to an anode of the third diode D3 and a second terminal connected to the first terminal of the second capacitor C2.

17. The method according to claim 11, wherein the level reversal module comprises:
- a third capacitor C3 having a first terminal connected to a second input of the driving module and a second terminal connected to a GND node for coupling to a ground potential;
- a fourth resistor R4 having a first terminal connected to a VCC node for coupling to a DC power supply;
- a fifth resistor R5 having a first terminal connected to a second terminal of the fourth resistor R4 and a second terminal connected to the GND node;
- a sixth resistor R6 having a first terminal connected to the first terminal of the fifth resistor R5 and a second terminal connected to the second input of the driving module; and
- a comparator having a negative input connected to the first terminal of the second capacitor C2, a positive input connected to the second terminal of the fourth resistor R4, and an output connected to the second input of the driving module.

18. The method according to claim 11, wherein the level reversal module comprises:
- a transistor having a collector terminal connected to a second input of the driving module, a base terminal connected to the first terminal of the second capacitor C2;
- a fourth resistor R4 having a first terminal connected to an emitter terminal of the transistor and a second terminal connected to a VCC node for coupling to a DC power supply;
- a fifth resistor R5 having a first terminal connected to the emitter terminal of the transistor and a second terminal connected to a GND node; and
- a sixth resistor R6 having a first terminal connected to the second input of the driving module and a second terminal connected to the VCC node.

* * * * *